United States Patent
Kobayashi et al.

[11] Patent Number: 6,144,574
[45] Date of Patent: Nov. 7, 2000

[54] ASSOCIATIVE MEMORY WITH A SHORTEST MASK OUTPUT FUNCTION AND SEARCH METHOD

[75] Inventors: Masayoshi Kobayashi; Tutomu Murase; Atsushi Kuriyama; Naoyuki Ogura, all of Tokyo, Japan

[73] Assignee: NEC Corporation, Tokyo, Japan

[21] Appl. No.: 09/441,122

[22] Filed: Nov. 17, 1999

[30] Foreign Application Priority Data

May 10, 1999 [JP] Japan ................................. 11-128275

[51] Int. Cl.[7] ................................................... G11C 15/00
[52] U.S. Cl. ......................................... 365/49; 365/189.07
[58] Field of Search .............................. 365/49, 189.07

[56] References Cited

U.S. PATENT DOCUMENTS 5,319,589  6/1994  Yamagata et al. ........................ 365/49
5,444,649  8/1995  Nemirovsky ..................... 365/189.07 X

FOREIGN PATENT DOCUMENTS 1-220293   9/1989   Japan .
2585227   11/1996   Japan .
9-45870    2/1997   Japan .
11-73782   3/1999   Japan .
11-86567   3/1999   Japan .

Primary Examiner—Huan Hoang

[57] ABSTRACT

An associative memory with a shortest mask output function has data cells, mask cells, comparators for the data cells, comparators for the mask cells, a first bit lines for inputting compared bits to the data cell comparators, and a second bit lines for inputting compared bits to the mask cell comparator, a search data are input to the first bit line and bit data corresponding to the shortest mask lines are input to the second bit line.

5 Claims, 11 Drawing Sheets

ASSOCIATIVE MEMORY WITH A SHORTEST MASK OUTPUT FUNCTION AND SEARCH METHOD

BACKGROUND OF THE INVENTION

1. Field of the Invention

The present invention relates to an associative memory and search method, and more particularly to an associative memory having a masking function.

2. Background of the Invention

As disclosed in the Japanese Unexamined Patent Publication (KOKAI) No.1-220293, an associative memory having mask information for each individual word or plurality of words has writing, and reading functions by specify the address such as a conventional memory, and additionally has a function of searching the memory for an address that has stored data that is the same as search data that is input to the memory, a masking function in which masking information is used to eliminate part of the stored data from a search operation, and a function of outputting an address at which the contents coincided with the specified search data.

Additionally, as disclosed in the Japanese Unexamined Patent Publication (KOKAI) No.11-073782, there is an associative memory that has a function which, when a plurality of stored data coincide with search data, selects the data that has the shortest mask.

The associative memory with a shortest mask output function disclosed in the Japanese Unexamined Patent Publication (KOKAI) No.11-073782 can be described as follows.

FIG. 8 is a block diagram of an example of the configuration of an associative memory with a shortest mask output function as disclosed in the Japanese Unexamined Patent Application publication H11-073782.

Referring to FIG. 8, this associative memory has an n-bit 2-input/1-output selector 17, m-word/n-bit associative memories 8-1 to 8-m, and an n-bit latch 21.

Each associative memory word 8-j (where $1 \leq k \leq m$) has associative memory cells 12-j-1 to 12-j-n, and a latch 20-j.

Each associative memory cell 12-j-k (where $1 \leq k \leq n$, and $1 \leq j \leq m$) has data cells 9-j-k (where $1 \leq k \leq n$ and $1 \leq j \leq m$) which stores data, comparators 11-j-k for performing a comparison between bit information stored in the data cells 9-j-k and the bit information 105-k corresponding to the externally input search data, mask cells 10-j-k which stores bit information corresponding to the mask information, mask comparators 18-j-k for performing a comparison between bit information stored in the mask cells 10-j-k and the bit information 22-k corresponding to the shortest mask information output from the n-bit latch 21, and logic circuit 13-j-k.

FIG. 9 shows an example of the configuration of an associative memory cell, in which the two bit lines 6a and 6b correspond to the bit lines shown in FIG. 8, this being represented in FIG. 8 by 6-i (where $1 \leq i \leq n$).

Writing of data into the associative memory cells and input of search data is performed via these two bit lines 6a and 6b.

In the case of writing data and the case of inputting search data, the data input to the bit line 6b is the data value of bit line 6a inverted.

The data cell 9 has the inverter (G1) 201 and the inverter (G2) 202, the inputs and outputs of which are mutually cross-connected so as to form a flip-flip, a MOS transistor (T1) 203 which serves as a transfer gate, inserted between the output end of the inverter (G2) 202 and the bit line 6a, a gate of which is connected to the data word line 14, this transistor 203 being placed in the conducting and non-conducting states by the high and low levels, respectively, of the data word line 14, and a MOS transistor (T2) 204 which serves as a transfer gate, inserted between the output end of the inverter (G1) 201 and the bit line 6b, a gate of which is connected to the data word line 14, this transistor 204 being placed in the conducting and non-conducting states by the high and low levels, respectively, of the data word line 14, the configuration of this data cell 9 being equivalent to that of a conventional static RAM (SRAM) element.

Similarly, the mask cell 10 has inverter (G3) 209 and the inverter (G4) 210, the inputs and outputs of which are mutually cross-connected so as to form a flip-flip, a MOS transistor (T7) 211 which serves as a transfer gate, inserted between the output end of the inverter (G4) 210 and the bit line 6a, gate of which is connected to the data word line 15, this transistor 211 being placed in the conducting and non-conducting states by the high and low levels, respectively, of the data word line 15, and a MOS transistor (T8) 212 which serves as a transfer gate, inserted between the output end of the inverter (G3) 209 and the bit line 6b, a gate of which is connected to the data word line 15, this transistor being placed in the conducting and non-conducting states by the high and low levels, respectively, of the data word line 15, the configuration of this mask cell 10 as well being equivalent to that of a conventional static SRAM element.

The comparator 11 is formed by a MOS transistor (T3) 205, a MOS transistor (T4) 206, a MOS transistor (T5) 207, and a MOS transistor (T6) 208.

The MOS transistor (T3) 205 and the MOS transistor (T4) 206 are connected in series between bit lines 6a and 6b, the gate of MOS transistor (T3) 205 being connected to the output of the inverter (G1) 201 in the data cell 9, this transistor 205 going into the conducting condition when the output end of the inverter (G1) 201 is at the high level. The gate of the MOS transistor (T4) 206 is connected to the output end of the inverter (G2) 202 in the data cell 9, this transistor 206 going into the conducting condition when the output end of the inverter (G2) 202 is at the high level.

The MOS transistor (T5) 207 and the MOS transistor (T6) 208 are connected in series between a low-potential power supply and the coincidence line 7, the gate of the MOS transistor (T5) 207 being connected to the connection node between the MOS transistor (T3) 205 and the MOS transistor (T4) 206, this transistor 207 going into the conducting condition when this node is at the high level.

The gate of the MOS transistor (T6) 208 is connected to the output end of the inverter (G3) 209 in the mask cell 10, this transistor 208 going into the conducting condition when the output end of the inverter (G3) 209 is at the high level.

When both the bit line 6a and the output end of the inverter (G1) 201 are at the high level, or when both the bit line 6b and the output end of the inverter (G2) 202 are at the high level, the connection node between the MOS transistor (T3) 205 and the MOS transistor (T4) 206 changes to the high level, so that the MOS transistor (T5) 207 conducts.

Therefore, in the case in which the stored data in the data cell 9 differs from the search data 105 on the bit lines 6a and 6b, the MOS transistor (T5) 207 goes into the conducting condition.

When the mask information stored in the mask cell 10 is 1, the MOS transistor (T6) 208 is in the non-conducting condition, and when this mask cell data is 0, this MOS transistor goes into the conducting condition.

The coincidence line 7 is either pulled up to a high potential by a resistance (not shown in the drawing) or is charged to a high potential before the start of the searching operation.

By doing this, as a plurality of associative memory cells 12 are connected to the coincidence line 7 via the respective MOS transistors (T6) 208, if one of the associative memory cells 12 is outputting the low level, the potential on the coincidence line 7 is at the low level, this action representing a wired-AND connection.

When both the MOS transistor (T5) 207 and the MOS transistor (T6) 208 are in the conducting condition, and the coincidence line 7 at the potential of the low level, the associative memory cell 12 outputs the invalid condition "0" to the coincidence line 7, but is in the high level for other states.

That is, the coincidence line 7 is always placed in the high level when the mask information is "1", and when the mask information is "0", if the search data 105 on the bits lines 6a and 6b and the stored data in the data cell 9 coincide, the high level is maintained. However, if the bit line 6a and 6b data and the stored data in the data cell 9 do not coincide, the invalid condition "0", that is, the low level is output.

The shortest mask line 4, as shown in FIG. 8, is pulled up to the high-potential power supply Vdd via the resistance 16, so that it is at the valid condition "1" before the search operation.

The logic circuit 13 is formed by the MOS transistor (T9) 213 and the MOS transistor (T10) 214, which are connected in series between the shortest mask line 4 and the low-potential power supply or ground.

The gate of the MOS transistor (T9) 213 is connected to the coincidence line 7, this transistor going into the conducting condition when the coincidence line 7 is in the valid condition "1", and being in the open-circuit condition when the coincidence line 7 is in the invalid condition "0". The gate of the MOS transistor (T10) 214 is connection to the output end of the inverter (G3) 209 in the mask cell 10, this transistor 214 going into the conducting condition when the output end of the inverter (G3) 209 is at the high level, and being in the open-circuit condition when the output of the inverter 209 is at the low level. That is, when the mask information that is stored in the mask cell 10 is the invalid value of "0", the transistor 214 conducts, and when it is the valid value of "1", the transistor 214 is in the open-circuit condition.

By means of the above, when the coincidence line 7 is the valid value of "1", that is at high level, and also the mask information stored in the mask cell 10 is the invalid value of "0", that is at low level, the logic circuit 13 outputs the invalid value of "0" to the shortest mask line 4, and places this line in the open-circuit condition under other conditions. Accordingly, when the coincidence line 7 is in high level, mask data in the mask cell 10 is output to the shortest mask line 4.

The mask comparator 18 and the mask coincidence line 19 are described below, with reference being made to FIG. 9.

The mask coincidence line 19 is either pulled up through a resistance (not shown in the drawing) or pre-charged to a high potential before the start of a search operation.

The mask comparator 18 is formed by MOS transistor (T11) 215, MOS transistor (T12) 216, and MOS transistor (T13) 217.

The MOS transistor (T11) 215 and the MOS transistor (T12) 216 are connected in series between the bit lines 6a and 6b, the gate of the MOS transistor (T11) 215 being connected to the output end of the inverter (G3) 209 in the mask cell 10. When the output end of the inverter (G3) 209 is at the high level, the MOS transistor (T11) 215 goes into the conducting condition. The gate of the MOS transistor (T12) 216 is connected to the output end of the inverter (G4) 210 in the mask cell 10, and when the output end of the inverter (G4) 210 is at the high level, the MOS transistor (T12) 216 goes into the conducting condition.

The MOS transistor (T13) 217 is connected in series between the low-potential power supply or ground and the mask coincidence line 19, the gate of this transistor 217 being connected to the connection node between the MOS transistor (T11) 215 and the MOS transistor (T12) 216, the MOS transistor (T13) 217 going into the conducting condition when the above-noted connection node is at the high level.

When both the bit line 6a and the output end of the inverter (G3) 209 are at the high level, or when both the bit line 6b and the output end of the inverter (G4) 210 are at the high level, the connection node between the MOS transistor (T11) 215 and the MOS transistor (T12) 216 changes to the high level and the MOS transistor (T13) 217 goes into the conducting condition, but is in the open-circuit condition at other times.

Therefore, in the case in which the mask information stored in the mask cell 10 is different from the search data 105 on the bit lines 6a and 6b, the MOS transistor (T5) 207 goes into the conducting condition, and the mask coincidence line 19 outputs an invalid value "0", that is, the mask coincidence line 19 becomes in the low level. In the case in the which there is coincidence, however, the mask coincidence line 19 is placed in the open-circuit condition (high level).

By doing the above, when a plurality of associative memory cells 12 are connected to the mask coincidence line 19 via respective MOS transistor (T13) 217, if one associative memory cell outputs the low level, the mask coincidence line 19 changes to the low level. In other cases, however, the mask coincidence line 19 is at the high level, this operation representing a wired-AND connection.

From the above-described configuration, the function of the associative memory cell 12 shown in FIG. 8 is implemented.

Returning to FIG. 8, the overall operation of the associative memory 10 is described below.

The n-bit 2-input/1-output selector 17, by means of a control signal 23, selects one from the search data 105-1 to 105-n and the latch output lines 22-1 to 22-n. Each associative memory word 8 outputs valid "1" or invalid "0" to respective mask coincidence line 19. For example, the first associative memory word 8-1 outputs valid "1" or invalid "0" to the mask coincidence line 19-1.

In the above arrangement, all associative memory cells 12 (12-j-1 to 12-j-n) of each associative memory word 8 are wired-AND connected to one mask coincidence line 19(19-j).

When the latch control signal 24 is in the valid state, the n-bit latch 21 stores the states of the shortest mask lines 4-1 to 4-n, the stored states being output to the latch output lines 22-1 to 22-n.

When the latch control signal 24 is valid, the latches 20-1 to 20-n store the states of respective coincidence lines 7-1 to 7-n of the associative memory words 8-1 to 8-n and output these stored states. The outputs of the latches 20-1 to 20-n are wired-logic connected to each mask coincidence line 19 of the words 8-1 to 8-n.

When the search operation is completed, of the mask coincidence lines 19-1 to 19-m indicated coincidence with the search data 105, only the lines that have the fewest bits that were eliminated from the search by the mask information are made valid, with the other lines being invalid.

In this process, valid condition for the mask information is "1", the invalid condition is "0", and the valid and invalid conditions for the shortest mask lines 4-1 to 4-8 are "1" and "0", respectively. The valid and invalid conditions for the coincidence lines 7-1 to 7-5 are "1" and "0", respectively, and the valid and invalid conditions for the mask coincidence lines 19-1 to 19-m are "1" and "0", respectively.

Before the start of the search operation, the mask coincidence lines 19-1 to 19-n are either pulled up to a high-potential power supply Vdd via a resistance (not shown in the drawing) or pre-charged to a high level, so that they are at the valid level of "1".

With respect to the mask coincidence lines 19-j corresponding to the latches 20-j, if the stored data in the latch 20-j is the invalid value of "0", the output of the latch 20-j is "0". Therefore, the corresponding mask coincidence line 19-j goes into invalid condition (low level).

The mask comparator 18 (18-j-k) performs a comparison between the state of the mask information stored in the mask cell 10 (10-j-k) and the shortest mask information on the corresponding bit lines 6 (6-k). If there is coincidence between the two, the corresponding mask coincidence line 19 (19-j) is placed in the high level, and if there is no coincidence, the corresponding mask coincidence line 19 (19-j) is becomes low level (invalid).

In the associative memory word 8 (8-j), therefore, if all MOS transistors (T13) 217 of the mask comparators 18 (18-j) of associative memory cells 12 (12-j-1 to 12-j-n) are in the non-conducting condition and the latches 20 (20-j) outputs high level, the mask coincidence line 19 (19-j) goes into the valid state of "1", but is in the invalid state "0" at other times, this operation representing a wired-AND connection.

That is, only in the case in which there is coincidence between mask information stored in the associative memory word 8 and the values on the bit lines 6-1 to 6-n and also the data stored in the latch 20 (20-j) is at the high level, the mask coincidence line 19 represents by the valid value of "1", it being the invalid value of "0" under other conditions. It is, of course, possible to implement this operation using a conventional logic gate.

FIG. 10 illustrates the operation of the conventional associative memory shown in FIG. 8, and is used to describe the operation of the associative memory 10. The valid states of the mask information is "1" which means mask condition, invalid state of the mask information is "0" which means no mask condition. The valid and invalid states of the shortest mask lines 4-1 to 4-8 are "1" and "0", respectively, and the valid and invalid states of the coincidence line 7-1 to 7-n, and the mask coincidence lines 19-1 to 19-5 is "1" and "0", respectively.

In the associative memory word 8-1, to implement (1, *, *, *), binary data (01, 00, 00, 00) is stored as the stored data, and binary data (00, 10, 11, 11) is stored as mask information.

In the same manner, (2, *, *, *) is stored in the associative memory word 8-2, (1, 2, 2, *) is stored in the associative memory words 8-3, (1, 2, *, *) is stored in the associative memory word 8-4, and (2, 3, 3, *) is stored in the associative memory word 8-5.

The operation of inputting (1, 2, 2, 3) as the search data 105 and performing a search is described below.

First, in accordance with the selection signal 23, the 8-bit, 2-input/1-output selector 17 selects the search data 105, and outputs it to bit lines 6-1 to 6-8.

By doing this, there are coincidence between bit lines and the data (1, *, *, *) in the associative memory word 8-1, and the bit lines and the data (1, 2, 2, *) stored in the associative memory word 8-3 and the data (1, 2, *, *) stored in the associative memory word 8-4.

Therefore, the three coincidence lines 7-1, 7-3 and 7-4 change to the valid "1" state, with the remaining coincidence lines 7-2 and 7-5 being in the invalid "0" state.

At this point, the logic AND value "0" of the mask information "0" corresponding to the shortest mask line 4-1 of the memory word 7-1, the mask information "0" corresponding to the shortest mask line 4-1 of the memory word 7-3 and the mask information "0" corresponding to the shortest mask line 4-1 of the memory word 7-4, is output from the shortest mask line 4-1.

The logic AND value "0" of the mask information "0" corresponding to the shortest mask line 4-2 of the memory word 7-1, the mask information "0" corresponding to the shortest mask line 4-2 of the memory word 7-3 and the mask information "0" corresponding to the shortest mask line 4-2 of the memory word 7-4, is output from the shortest mask line 4-2.

Thereafter, in the same manner, the logical AND value "0" (=1×0×0) is output from the shortest mask line 4-3, the logical AND value "0" (=1×0×0) is output from the shortest mask line 4-4, the logical AND value "0" (=1×0×1) is output from the shortest mask line 4-5, the logical AND value "0" (=1×0×1) is output from the shortest mask line 4-6, the logical AND value "1" (=1×1×1) is output from the shortest mask line 4-7, and the logical AND value "1" (=1×1×1) is output from the shortest mask line 4-8.

Therefore, the shortest mask lines 4-1 to 4-8 output the binary value of 00000011, respectively, and the n-bit latch 21 internally stores the states of the shortest mask lines 4-1 to 4-8. The binary value 00000011 is stored in the n-bit latch 21, this n-bit latch 21 outputting the value 00000011 to the latch output line 22 (22-1 to 22-n).

In this condition, the latch control signal 24 becomes valid, and the latches 20-1 to 20-5 store the states of the corresponding coincidence lines 7-1 to 7-5, simultaneously, "0" is stored in latch 20-1, "0" is stored in latch 20-2, "1" is stored in latch 20-3, "1" is stored in latch 20-4, and "0" is stored in latch 20-5.

Next, in accordance with the selection signal 23, the 8-bit 2-input/1-output selector 17 selects the latch output line 22, the information 00000011 thereof being output to the corresponding bit lines 6-1 to 6-8, after which the associative memory 10 starts the second search operation.

At the second search operation, the states of the mask coincidence lines 19-1 to 19-8 are used, and the states of the coincidence lines 7-1 to 7-8 are ignored.

Before the start of the second search operation, the mask coincidence lines 19-1 to 19-8 are either pre-charged to a high level or pulled up to a high level via a resistance (not shown in the drawing), so that they are in the valid state "1".

With respect to the 00000011 states of the bit lines 6-1 to 6-8, the states of the bit lines 6-1 to 6-8 completely coincide with the mask information stored in the associative memory words 8-3 and 8-5, so that the corresponding coincidence lines 19-3 and 19-5 are placed in the open-circuit condition.

Because the mask information stored in the other associative memory words 8-1, 8-2, and 8-4 does not coincide, the invalid state "0" is output at the corresponding mask coincidence lines 19-1, 19-2, and 19-4.

The latch 20-1 outputs the stored state "1" to the corresponding coincidence line 19-1, the latch 20-2 outputs the stored state "0" to the corresponding coincidence line 19-2, the latch 20-3 outputs the state "1" to the corresponding coincidence line 19-3, the latch 20-4 outputs the state "1" to the corresponding coincidence line 19-4, and the latch 20-5 outputs the state "0" to the corresponding coincidence line 19-5.

Therefore, for the mask coincidence line 19-1 of the associative memory word 8-1, because the mask comparator output "0" and the latch 20-1 output "1", the state of the mask coincidence line 19-1 is the invalid "0" state.

For the mask coincidence line 19-2 of the associative memory word 8-2, because the mask comparator output "0" and the latch 20-2 output "0", the state of the mask coincidence line 19-2 is the invalid "0" state.

For the mask coincidence line 19-3 of the associative memory word 8-3, because the mask comparator output "1" and the latch 20-3 output "1", the state of the mask coincidence line 19-3 is the invalid "1" state.

For the mask coincidence line 19-4 of the associative memory word 8-4, because the mask comparator output "0" and the latch 20-4 output "1", the state of the mask coincidence line 19-4 is the invalid "0" state.

For the mask coincidence line 19-5 of the associative memory word 8-5, because the mask comparator output "0" and the latch 20-5 output "0", the state of the mask coincidence line 19-5 is the invalid "0" state.

In accordance with the above, it can be seen that only the mask coincidence line which correspond to the associative memory words 8-1 to 8-5 that coincide with the search data 105, at the first search operation, taking into consideration the mask information, and that coincide with the states of the shortest mask lines 4-1 to 4-8 that is obtained at the end of the second search operation.

The associative memory word that corresponds to the mask coincidence lines that is in the valid state at the end of the second search operation is the words for which the mask information has the fewest valid bits, and the word for which there is coincidence with the search data 105, over the longest parts.

FIG. 11 is a timing diagram showing the above-noted first and second search operations, in which [1] to [4] indicate clock cycles.

In clock cycle [1], all the bit lines 6, the coincidence lines 7, and the mask coincidence lines 19 are pre-charged to a high level "1".

In the clock cycle [2], at the rising edge of the clock, bit information corresponding to search data is output to each bit line. If this bit information and the corresponding stored data bit information in each associative memory word coincide or if the bit data of the mask information corresponding to that of search data 105 is "1", the coincidence line of that memory word becomes the valid value "1", with the coincidence lines of other associative memory words being the invalid value of "0". Additionally, the logical AND of the mask bit information corresponding to associative memory words in the valid state is output to the shortest mask lines. At this point the latch control signal 24 is made active, so that the state of the coincidence line of each memory word is stored in latch 20. The bit information of each shortest mask line is stored in the n-bit latch 21, and is also output to the latch output line 22.

Next, in the clock cycle [3], all bit lines, coincidence lines 7 and mask coincidence lines 19 are pre-charged to a high level. With regard to the mask coincidence lines 19, pre-charging to a high level is only done to the mask coincidence lines of associative memory words for which a "1" is stored in the latch 20.

In the clock cycle [4], at the rising edge of the clock, in accordance with the selection signal 23, the bit information at each latch output line 22 is output to the corresponding bit line 6. Then only the mask coincidence lines 19 for which the bit information on the latch output lines 22 coincides with the mask information stored in the associative memory word and for which "1" is stored in the latch 20 are output as the valid value of "1".

As described above, using an associative memory with a shortest mask output function of the prior art, of the word for which there is coincidence, considering the mask information, at two clocks, the mask coincidence line of the associative memory word that has the shortest bit length of valid mask bits, that is, the mask coincidence line of word that has the longest parts in coincidence with the search data is set to the valid value of "1", enabling selection of this word.

In the above-described associative memory with a shortest mask output function according to prior art, however, in the above-noted first and second search operations, because the search data is performed by using bit lines 6-1 to 6-n, when a continuous search is performed, it is not possible to perform pipeline searching. That is, the next search cannot be started until the second search of the previous search operation has been completed.

For this reason, there is the problem with regard to searching performance that only an excessively small number of searches can performed within a given period of time.

Accordingly, it is an object of the present invention, in consideration of the above-noted drawback of the prior art, to provide an associative memory which enables the start of the first search operation of a subsequent search to be started simultaneously with the execution of the second search operation of the previous search, thereby providing an improvement in the number of searches that can be performed in a given period of time.

SUMMARY OF THE INVENTION

To achieve the above-noted object, the present invention adopts the following basic technical constitution.

The first aspect of the present invention is an associative memory with a shortest mask output function comprising, a plurality of data cells that store data to be searched, a plurality of mask cells that store mask data corresponding to said data stored in said data cells, a plurality of first comparators for said data cells which compare a search data with said data stored in said data cells, a plurality of second comparators for said mask cells which compare a shortest mask data with said mask data stored in said mask cells, a plurality of shortest mask lines which detect said shortest mask data which are obtained based on comparison results of said first comparators and said mask data stored in said mask cells, wherein said associative memory comprising a first bit lines for inputting said search data to said first comparators, and a second bit lines for inputting said shortest mask data to said second comparators.

The second aspect of the present invention is an associative memory, said associative memory further comprising, a plurality of coincidence lines which output said comparison results of said first comparators, a plurality of mask coincidence lines which output comparison results of said second comparators, a plurality of logic circuits which control said shortest mask lines based on said comparison results of said first comparators and mask data stored in said mask cells, a plurality of first latches which hold states of said coincidence lines and control said mask coincidence lines based on states of said coincidence lines, a second latch which outputs said shortest mask data to said second bit lines.

In a search method, the first aspect of the present invention is a search method of an associative memory with a shortest mask output function having a plurality of associative memories, said associative memories comprising a plurality of data cells that store data to be searched and a plurality of mask cells that store mask data corresponding to said data stored in said data cell, first comparators for said data cells which compare a search data with said data stored in said data cells, second comparators for said mask cells which compare a shortest mask data with said mask data stored in said mask cells, a plurality of shortest mask lines which detect said shortest mask data which are obtained based on comparison results of said first comparators and said mask data stored in said mask cells, a first bit lines for inputting said search data to said first comparators, a second bit lines for inputting said shortest mask data to said second comparators, a plurality of coincidence lines which outputs said comparison results of said first comparators, a plurality of mask coincidence lines which outputs comparison results of said second comparators, a plurality of logic circuits which control said shortest mask lines based on said comparison results of said first comparators and mask data stored in said mask cells, a plurality of first latches which holds state of said coincidence line and controls said mask coincidence line based on states of said coincidence line, a second latch which outputs said shortest mask data to said second bit lines, wherein at a first search operation, said search data is input to each associative memory word from said first bit lines, a comparison being performed by said first comparator between said data cell value included in each of said associative memory words with said first bit line value, using said mask data in said mask cell, coincidence lines corresponding to associative memories word for which coincidence are detected by said first comparators, being made valid state, a state of said coincidence line is being held in said first latch, a plurality of said logic circuit control said shortest mask lines based on said comparison results of said first comparators and mask data stored in said mask cells, a result of taking a wired-AND at each shortest mask line being stored in said second latch, and at a second search operation, output data of said second latch is input to said second comparator of each associative memory word via said second bit lines, a comparison between a value on said second bit lines and a value of said mask cell stored in said mask cell being performed in each associative memory word, only mask coincidence line of said associative memory word not only for which mask data in said mask cell coincides with bit data on said second bit lines but also for which said first latch holds coincidence data on said coincidence line, being made valid.

The second aspect of a search method of the present invention is that, when performing continuous searching, said associative memory performs said second search operation of a previous search simultaneously with said first search operation of a subsequent search.

The third search method of the present invention is a search method of an associative memory with a shortest mask output function, said associative memory being used for a router to perform forwarding of Internet Protocol packets, said associative memory including an IP forwarding table comprising groups of destination fields and corresponding output interface information fields wherein at a first search operation, an associative memory words for which prefix data that is designated an arbitrary length string of bits starting from a MSB of an IP address coincides with a search data, are selected, and detects shortest mask corresponding to an associative memory word having the longest prefix of a plurality of coinciding associative memories, and at a second search operation, said shortest mask obtained at said first search operation is supplied to mask comparators of said associative memories, whereby obtain an associative memory word having said shortest mask.

DESCRIPTION OF THE PREFERRED EMBODIMENTS

Preferred embodiments of the present invention are described below in detail, with references being made to relevant accompanying drawings. An associative memory with a shortest mask output function according to the present invention, has the first bit lines for inputting the first search data to the comparators for the data cells, and the second bit lines for inputting the second search data to the comparators for the mask cells. The second data obtained from the shortest mask lines are input to the second bit lines.

In an associative memory having a shortest mask output function according to the present invention, a search with regard to search data 105 is performed by executing two search operations.

In the above-noted associative memory with shortest mask output function according to the prior art, because the bit lines for input of compared bits to the comparators for the data cells and the bit lines for input of compared bits to the comparators for the mask cells use the same bit lines, when performing continuous searching of search data, it was not possible to start the first search operation of a particular search for search data until the completion of the second search operation of the previous search for search data.

According to the present invention, however, because the bit lines for input of the compared bits to comparators for the data cells are separated from the bit lines for input of compared bits to mask comparators, it is possible to perform the first search operation for search data simultaneously with the second search operation of the previous search. For this reason, searching can be performed in pipeline fashion, thereby enabling an increase in the number of searches that can be performed in a given period of time.

Figure 1:
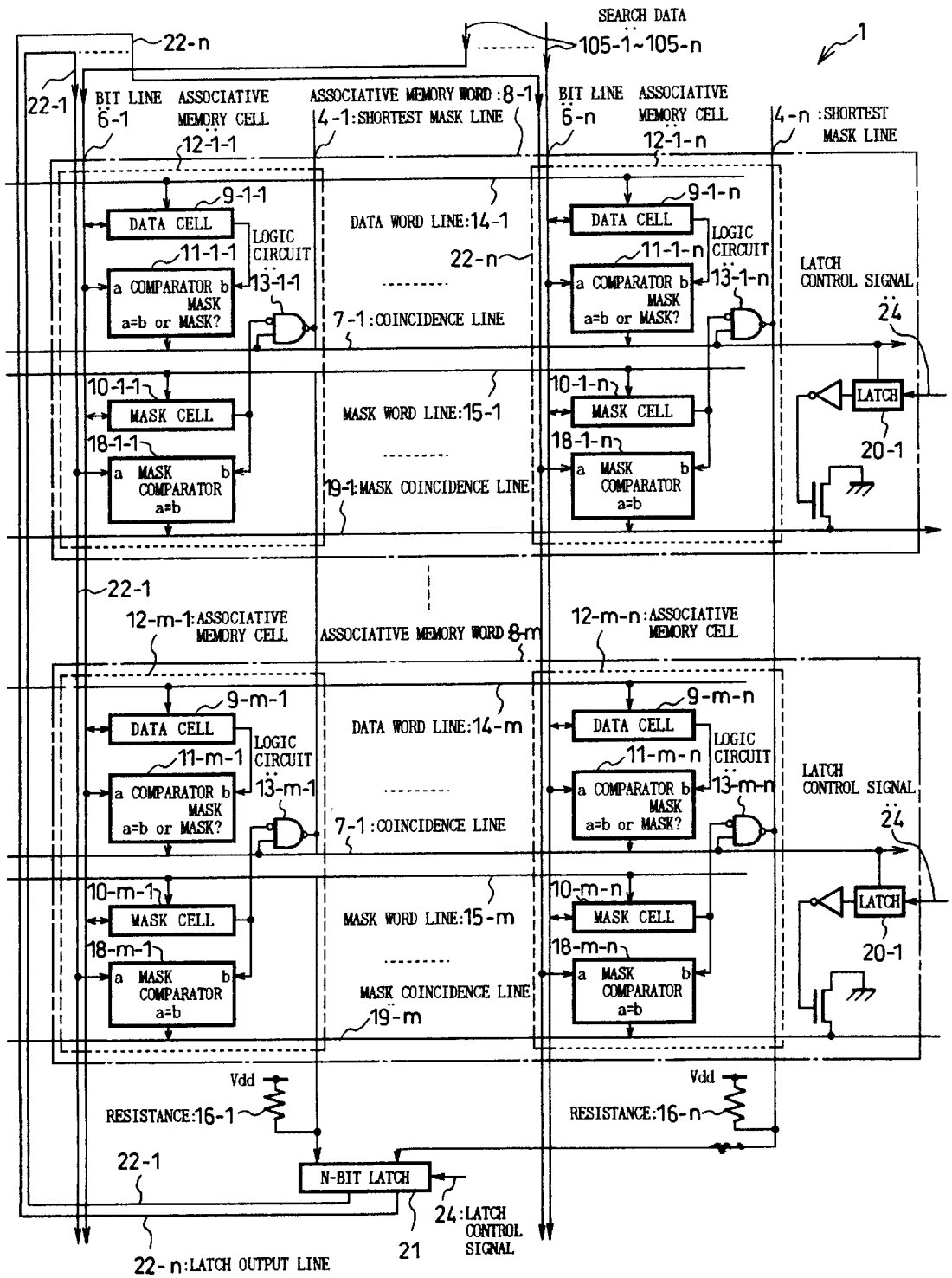
FIG. 1 is a block diagram showing the configuration of an embodiment of an associative memory according to the present invention.
Figure 2:
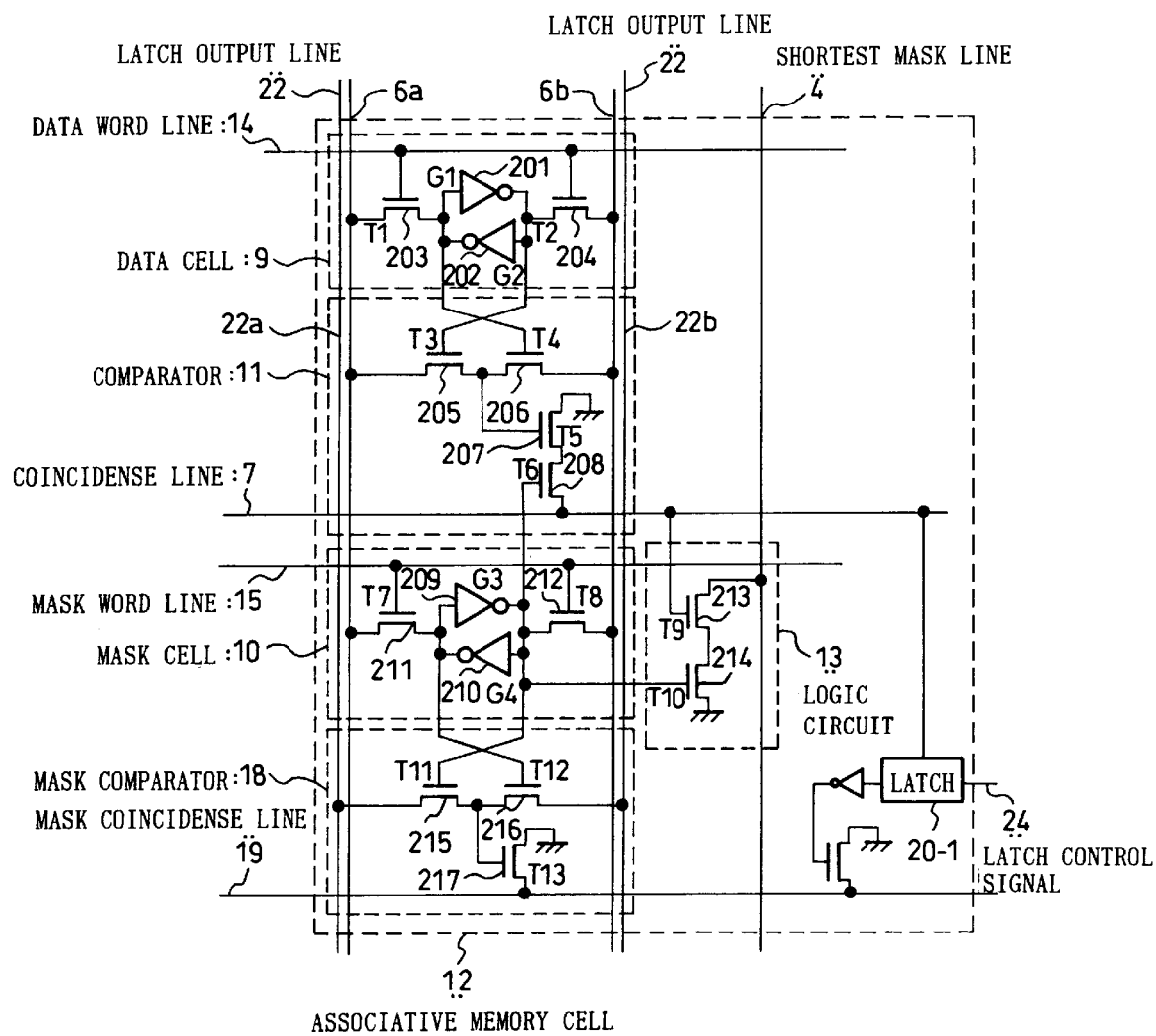
FIG. 2 is a drawing that illustrates the associative memory cells of an embodiment of an associative memory according to the present invention.

Referring to FIG. 1 and FIG. 2, an associative memory according to the present invention has n bits of m-word associative memory words 8, and an n-bit latch 21, each of the associative memory words 8 having an associative memory cell 12 and a latch 20 that latches the state of the coincidence line. Each associative memory cell 12 has a data cell 9, into which is stored bit information input via the bit line 6, a comparator 11 that compares bit information stored in the data cell with bit information 105 of a search data, a mask cell 10, into which is stored bit information input via bit line 6, and a mask comparator 18 that compares bit information stored in the mask cell with bit information of shortest mask information output from the n-bit latch 21. The output of the latch 20 are connected by wired logic along with the output of the mask comparator 18 of the associative memory cell 12 to the mask coincidence line 19.

Two search operations are performed with respect to each search data. When the first search operation is performed, the search data 105 is simultaneously input to each associative memory word 8-1 to 8-n, using the bit lines 6-1 to 6-n, and at each associative memory word, a comparison is performed between the data stored in the data cells that are included in the associative memory word with bit line values, using the mask cells stored in the same associative memory word. For memory words for which coincidence occurs, the corresponding coincidence line is made valid, an the mask cell value is output to the shortest mask line 4-1 to 4-n.

For an associative memory word for which coincidence does not exist, the coincidence line is not made valid, and the value "0" is output to the shortest mask line, a wired-AND being taken of each shortest mask line 4, the result thereof being stored in the n-bit latch 21. The state of each coincidence line 7-1 to 7-n is also stored in the latch 20-1 to 20-n.

At the second search operation, the data of the n-bit latch 21 is input to the mask comparator 18 for each associative memory word, using the latch output line 22, and at each associative memory word, a comparison is made of the value of the latch output line 22 with the mask cell 10 value. For associative memory word exhibiting coincidence, the mask coincidence line 19 is made valid so as to obtain the search result.

At this second search operation, because the lines for input of compared bits to the comparators 11 for the data cells 9 and the lines for input of compared bits to mask comparators 18 for the mask cells 10 are separated respectively into the bit line 6 and the latch output lines 22, when performing continuous searching, it is possible to execute the first search operation of subsequent search simultaneously with the second search operation of the previous search, thereby enabling an improvement in the number of searches that can be accomplished within a given period of time.

An embodiment of the present invention is described in further detail below, with references being made to relevant accompanying drawings.

FIG. 1 is a block diagram showing the configuration of an embodiment of the present invention. Referring to FIG. 1, the associative memory 1 has m words of n bits of associative memory words 8-1 to 8-m, and an n-bit latch 21, each of the associative memory words 8-j (where $1 \leq j \leq m$) having n associative memory cells 12-j-1 to 12-j-n and one latch 20-j.

Each associative memory cell 12-j-k (where $1 \leq k \leq n$ and $1 \leq j \leq m$) has a data cell 9-j-k, into which is stored bit information that is externally input via the bit line 6-k (where $1 \leq k \leq n$), a comparator 11-j-k which performs a comparison between bit information stored in the data cell 9-j-k and bit information 105-k that input as a search data, a mask cell 10-j-k into which is stored bit information that is input via the bit line 6-k, a mask comparator 18-j-k which performs a comparison between bit information stored in the mask cell and bit information (latch output) 22-k corresponding to shortest mask information output from the n-bit latch 21, and a logic circuit 13-j-k.

FIG. 2 shows the configuration of an associative memory cell in the above-noted embodiment of the present invention, this drawing showing the two latch output lines 22a and 22b, which correspond to the latch lines shown in FIG. 1, these being represented by 22-i in FIG. 1.

Figure 8:
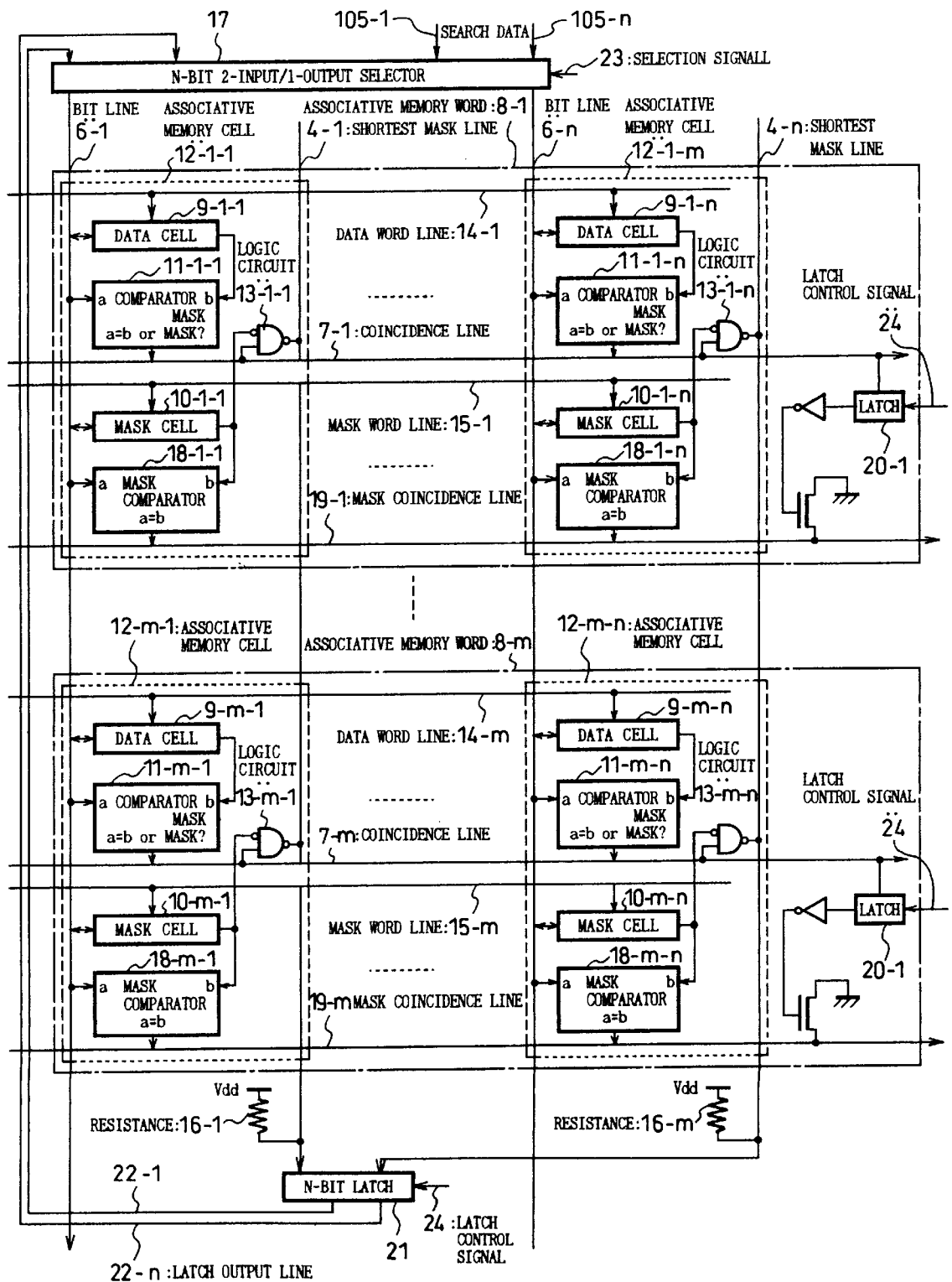
FIG. 8 is a block diagram showing the configuration of a prior art associative memory with a shortest mask output function.
Figure 9:
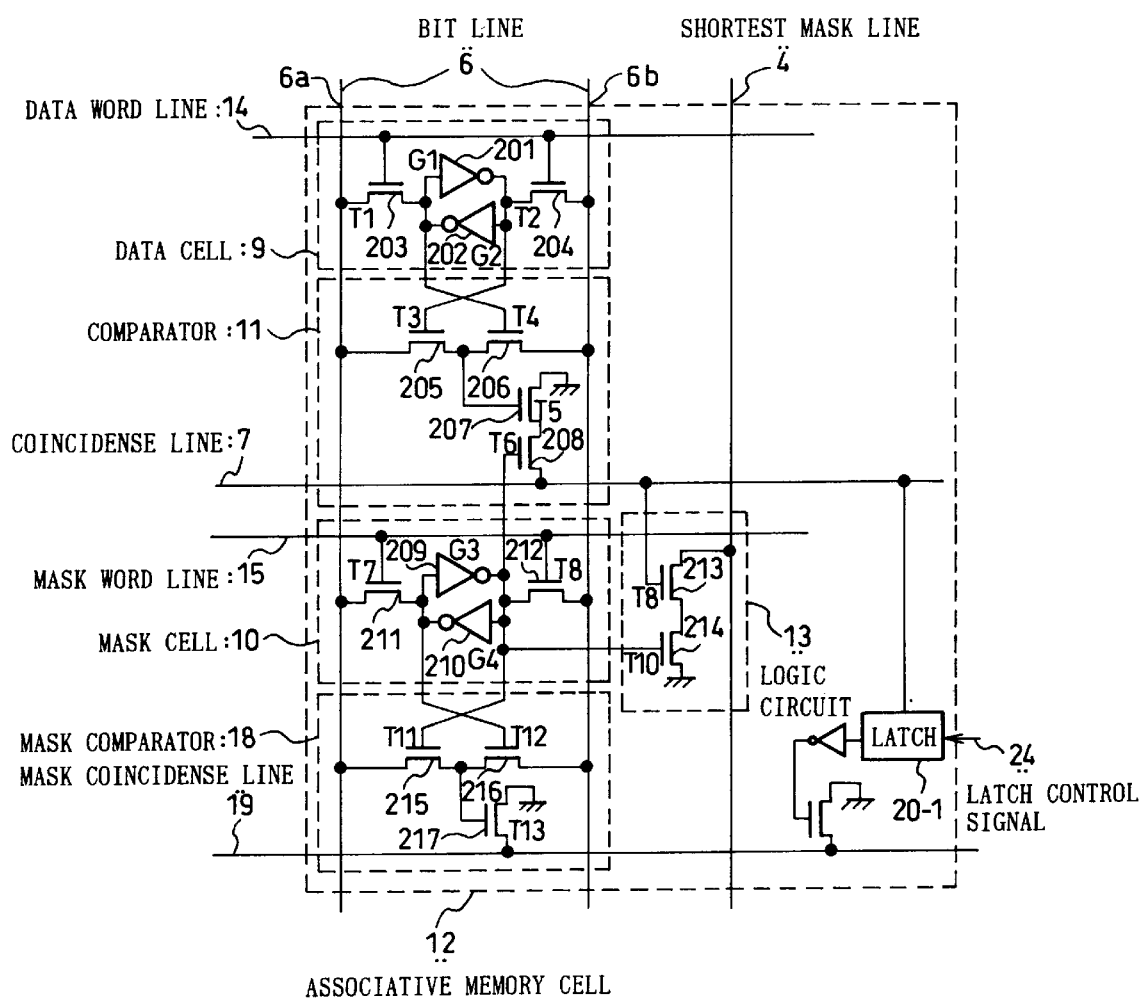
FIG. 9 is a drawing illustrating the memory cells of a prior art associative memory with a shortest mask output function.
Figure 10:
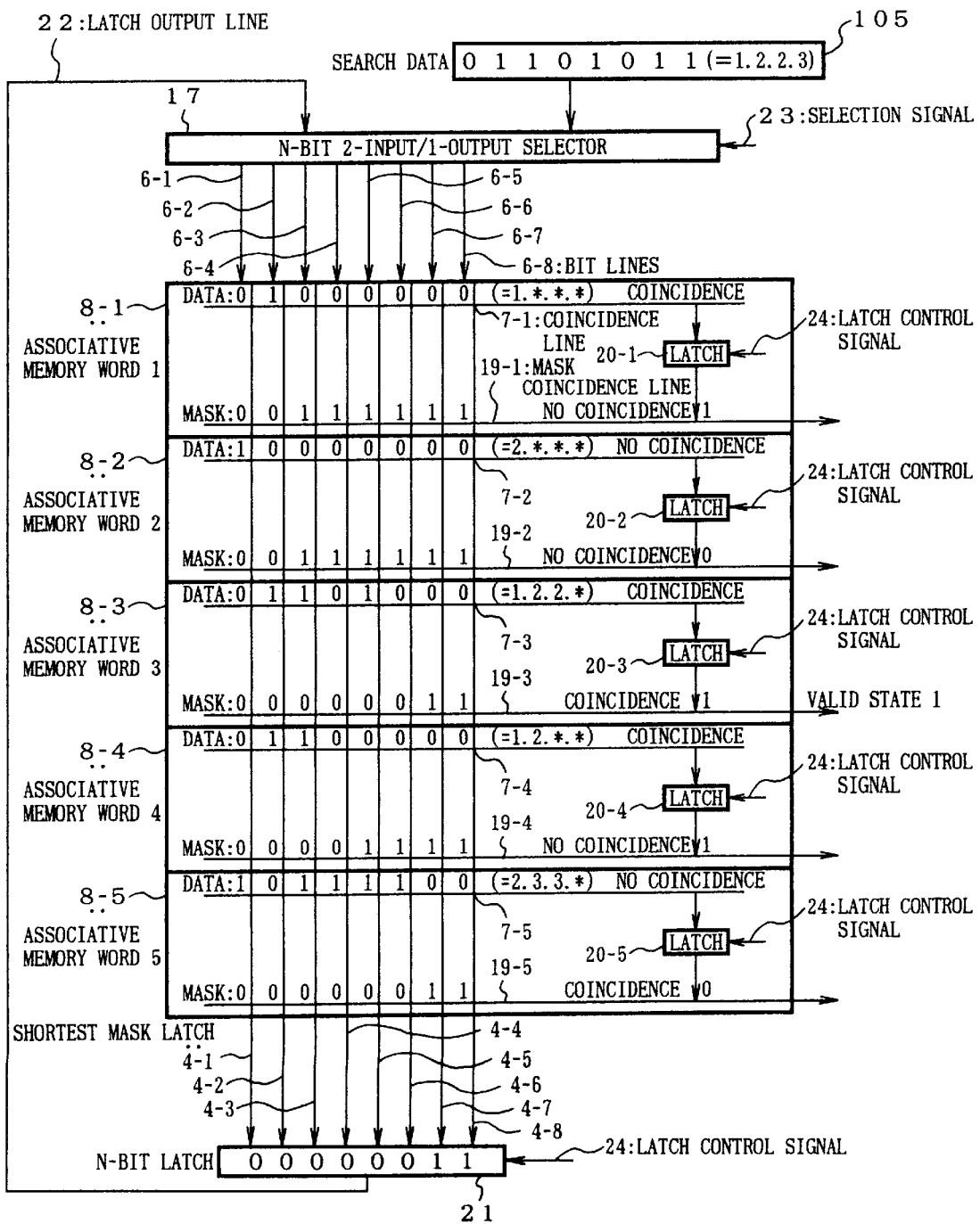
FIG. 10 is a drawing illustrating the operation of a prior art associative memory with a shortest mask output function.
Figure 11:
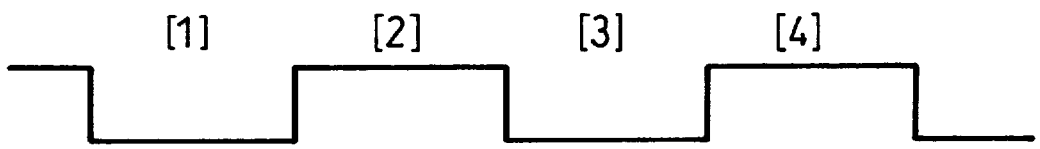
FIG. 11 is a timing diagram illustrating the operation of a prior art associative memory with a shortest mask function.

As can be seen by comparing the associative memory cell of the prior art as shown in FIG. 8 with FIG. 2, in the associative memory cell according to the present invention, rather than connecting the MOS transistor (T11) 215 and the MOS transistor (T12) 216 of the mask comparator 18 to the bit lines 6a and 6b respectively, they are connected respectively to the latch outputs 21a and 21b, this being the difference with respect to the associative memory cell of the prior art shown as shown in FIG. 8. The difference between the associative memory word of the present invention and conventional associative memory word will be described below, while common elements such as the data cell 9 and the comparator 11 are not explicitly described herein.

The mask comparator 18 is formed by a MOS transistor (T11) 215, a MOS transistor (T12) 216, and a MOS transistor (T13) 217. The MOS transistors (T11) 215 and (T12) 216 are connected in series between the latch output lines 21a and 21b, and the gate of the MOS transistor (T1) 215 is connected to the output end of the inverter (G3) 209 in the mask cell 10, this transistor being in the conducting condition when the output end of the inverter (G3) 209 is at the high level. The gate of the MOS transistor (T12) 216 is connected to the output end of the inverter (G4) 210 in the mask cell 10, this transistor being in the conducting condition when the output end of the inverter (G4) 210 is at the high level.

The MOS transistor (T13) 217 is connected between the low-potential power supply or ground and the mask coincidence line 19, the gate of this transistor being connected to the connection node between the MOS transistor (T11) 215 and the MOS transistor (T12) 216, and this transistor being in the conducting condition when that connection node is at the high level.

When both the latch output line 21*a* and the output end of the inverter (G3) 209 are at the high level or both the latch output line 21*b* and the output end of the inverter (G4) 210 are at the high level, the connection node between the MOS transistor (T11) 215 and the MOS transistor (T12) 216 changes to the high level, the MOS transistor (T13) conducts, but is in the open-circuit condition at other times.

Therefore, in the case in which the mask information stored in the mask cell 10 differs from the shortest mask information on the latch output lines 21*a* and 21*b*, the MOS transistor (T15) 207 goes into the conducting condition, the invalid value "0" being output to the mask coincidence line 19, but in the case in which there is coincidence, the coincidence line 19 is at the high level.

By doing the above, when a plurality of memory cells 12 are connected to the mask coincidence line 19 via each MOS transistor (T13) 217, if one of the associative memory cells is outputting a low level, the mask coincidence line 19 is at the low level, and in any other condition, the coincidence line 19 is at the high level, this operation representing a wired-AND connection.

The above is the configuration of an associative memory cell in an embodiment of the present invention.

Returning to FIG. 1, the overall operation of the associative memory of the present invention is described below.

Bit values that correspond to the search data 105-1 to 105-n are output to the bit lines 6-1 to 6-n. Each of the corresponding associative memory words 8 has a mask coincidence line 19. For example, the first associative memory word 8-1 has the mask coincidence line 19-1. In this memory, all of the associative memory cells 12-j-1 to 12-j-n of the associative memory word 8-j are connected in wired-logic fashion to a single corresponding mask coincidence line 19-j.

When the latch control signal 24 is in the valid state, the n-bit latch 21 stores the states of the shortest mask lines 4-1 to 4-n. These stored states are output to the latch output lines 22-1 to 22-n.

When the latch control signal 24 is in the valid state, the latches 20-1 to 20-m store the states of the coincidence lines 7-1 to 7-m, respectively. The outputs of the latches 20-1 to 20-m are connected in wired-logic fashion to a single mask coincidence line 19-1 to 19-m, respectively.

When the search operation is completed, only the mask coincidence lines 19-1 to 19-m correspond to associative memory word 8-1 for which there were coincidence with the search data 105, and for which the number of bits that were excepted by the mask information from the bits to be compared were fewest, is made valid, the others being made invalid.

In this embodiment, the valid and invalid states for the mask information are "1" and "0", as are the valid and invalid states for the shortest mask lines 4-1 to 4-8. The valid and invalid states for the coincidence lines 7-1 to 7-5 are "1" and "0", respectively, as are the valid and invalid states for the mask coincidence lines 19-1 to 19-m.

By either pulling up the mask coincidence lines 19-1 to 19-m via a resistance (not shown in the drawing) or precharging these lines to a high level, they are placed in the valid state "1" before the start of a search operation.

If the latch 20-j stores the invalid value of "0", this latch 20-j outputs "0" to the mask coincidence lines 19-j, and if the stored data is the valid value of "1", the corresponding mask coincidence lines 19-j are placed in the open-circuit condition.

The mask comparator 18-j-k in each of the associative memory cells corresponds to the mask cells 10-j-k, the latch output lines 21-j, and the mask coincidence lines 19-j in the same associative memory cell of the memory cells 12-j-k.

The mask comparator 18 performs a comparison between the mask information stored in the corresponding mask cell 10 and the shortest mask information on the latch output line 21 and, if these coincide, the mask comparator 18 outputs a valid value of "1" to the corresponding mask coincidence line 19, but outputs an invalid value of "0" to the corresponding mask information line 19 if there is no coincidence.

That is, only when there is total coincidence between the mask information stored in the associative memory word 8 and the bit lines 6-1 to 6-n and also the state of the coincidence line 7 stored in the latch 20 is the valid state of "1", the mask coincidence line 19 is in the valid state of "1", this being the invalid state "0" at all other times. Of course, it is possible to implement this operation using a conventional logic gate.

Figure 3:
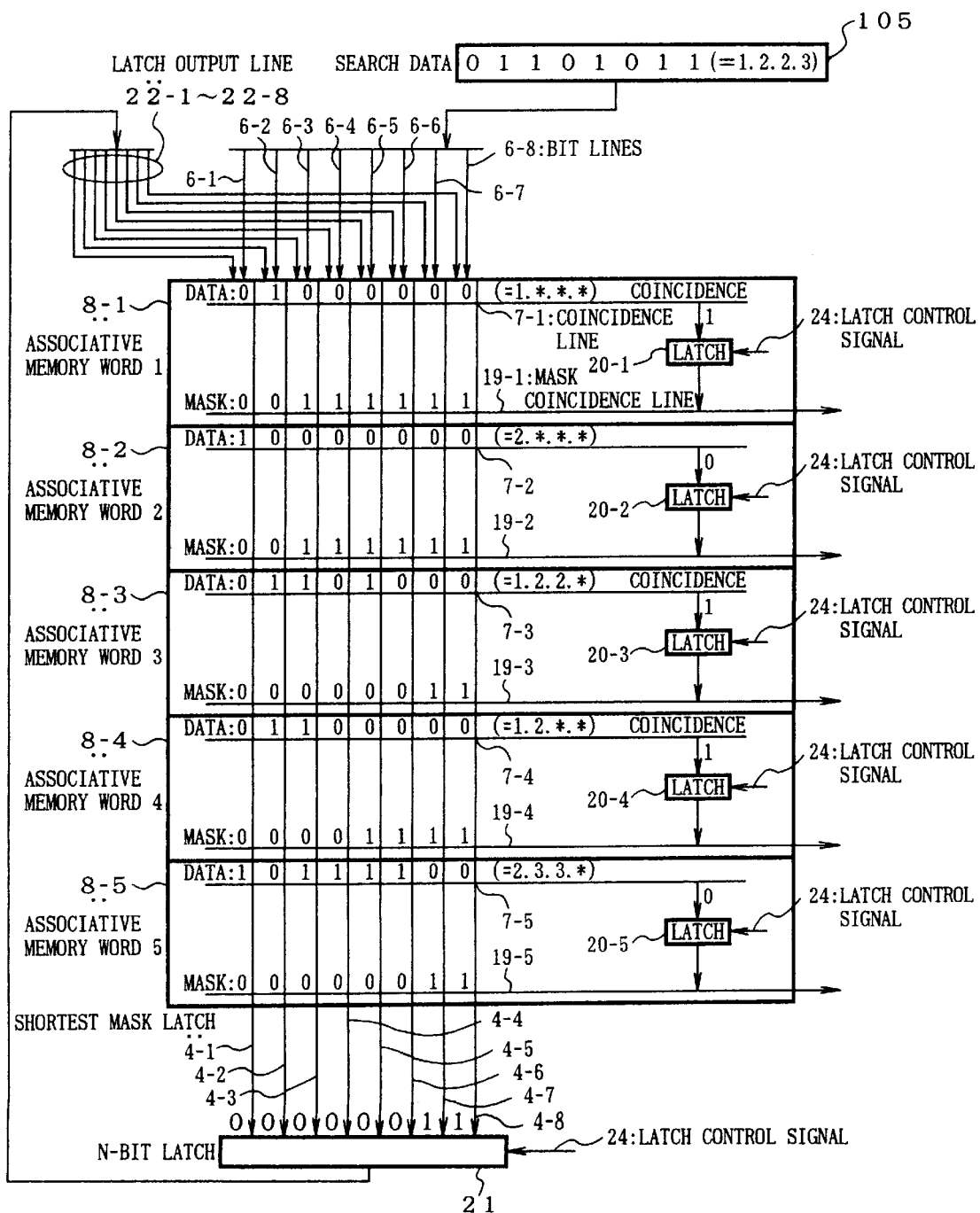
FIG. 3 is drawing that illustrates the operation of an embodiment of an associative memory according to the present invention.
Figure 4:
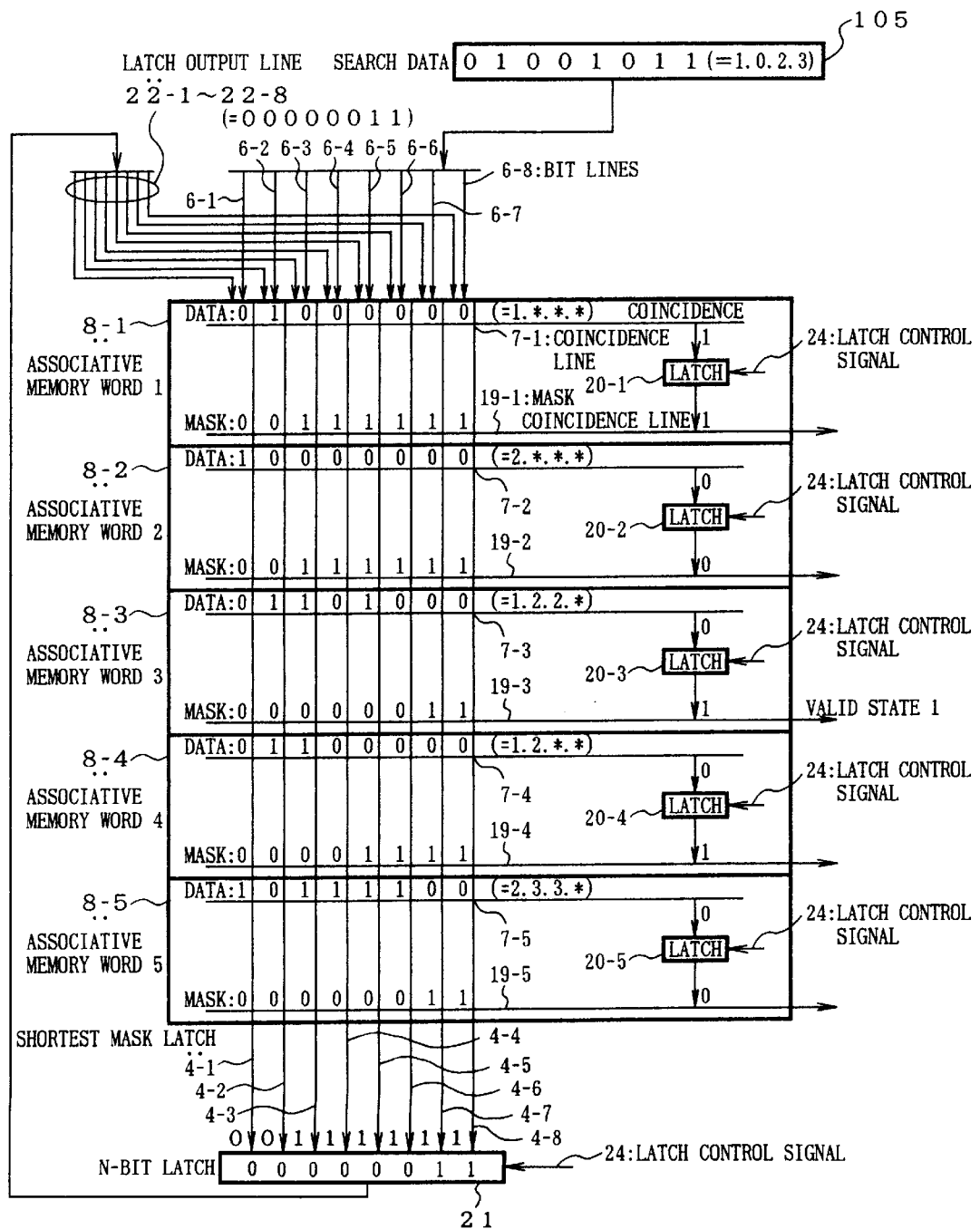
FIG. 4 is a drawing that illustrates the operation of an embodiment of an associative memory according to the present invention.
Figure 5:
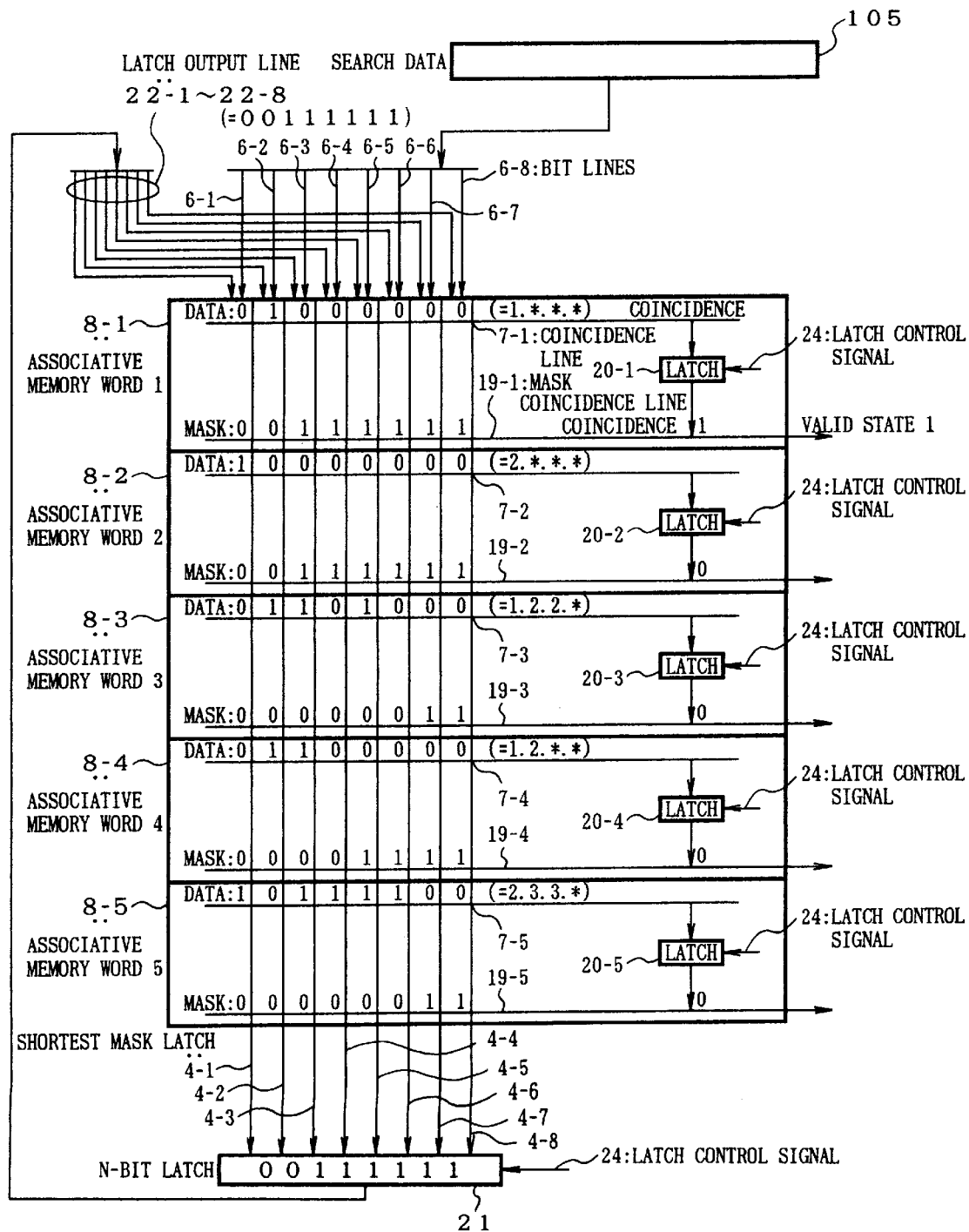
FIG. 5 is a drawing that illustrates the operation of an embodiment of an associative memory according to the present invention.

FIG. 3 to FIG. 5 illustrate the operation of the above-noted embodiment of the present invention.

The valid and invalid states of the mask information are "1" and "0", respectively, as are the valid and invalid states of the shortest mask lines 4-1 to 4-8. The valid and invalid states of the coincidence lines 7-1 to 7-5 and the mask coincidence lines 19-1 to 19-5 are "1" and "0", respectively. The associative memory 1 is assumed to be made up of five 8-bit words for the purpose of this description.

As shown in FIG. 3 to FIG. 5, in the associative memory word 8-1, to implement (1, *, *, *), the binary data (01, 00, 00, 00) is stored in the data cell 9-1, and the binary data (00, 11, 11, 11) as mask information is stored in the mask cell 10-1. In the same manner, (2, * , *, *) is stored in the associative memory word 8-2, (1, 2, 2, *) is stored in the associative memory words 8-3, (1, 2, *, *) is stored in the associative memory word 8-4, and (2, 3, 3, *) is stored in the associative memory word 8-5.

An example of operation is described below to continuously input (1, 2, 2, 3) and (1, 0, 2, 3). FIG. 3 to FIG. 5 show the sequential states of the associative memory 1.

First, as shown in FIG. 3, the bit data corresponding to the search data (1, 2, 2, 3) are output to the bit lines 6-1 to 6-8. By doing this, the data (1, *, *, *) in the associative memory word 8-1, the data (1, 2, 2, *) stored in the associative memory word 8-3 and the data (1, 2, *, *) stored in the associative memory word 8-4 coincide with the search data 105 of the bit lines. Therefore, the three coincidence lines 7-1, 7-3 and 7-4 are placed in the valid state of "1", the remaining coincidence lines 7-2 and 7-5 being in the invalid state of "0".

The shortest mask line 4-1, by the logical AND of the mask information "0" corresponding to the shortest mask line 4-1 in the memory word 8-1 and the mask information "0" corresponding to the shortest mask line 4-1 in the memory word 8-3 and the mask information "0" corresponding to the shortest mask line 4-1 in the memory word 8-4, outputs the value of "0".

The shortest mask line 4-2, by the logical AND of the mask information "0" corresponding to the shortest mask line 4-1 in the memory word 8-1 and the mask information "0" corresponding to the shortest mask line 4-2 in the memory word 8-3 and the mask information "0" corresponding to the shortest mask line 4-2 in the memory word 8-4, outputs the value of "0".

Thereafter, in the same manner, "0" is output from the shortest mask line 4-3 as the result of logical AND of (1×0×0), "0" is output from the shortest mask line 4-4 as the result of logical AND of (1×0×0), "0" is output from the shortest mask line 4-5 as the result of logical AND of (1×0×1), "0" is output from the shortest mask line 4-6 as the result of logical AND of (1×0×1), "1" is output from the shortest mask line 4-7 as the result of logical AND of (1×1×1), and "1" is output from the shortest mask line 4-8 as the result of logical AND of (1×1×1).

Therefore, the binary value of 00000011 is output to the shortest mask lines 4-1 to 4-8.

In this condition, the latch control signal 24 becomes valid, and the latches 20-1 to 20-5 store the states of the corresponding coincidence lines 7-1 to 7-5, and the n-bit latch 21 stores the states of the shortest mask lines 4-1 to 4-8. Therefore, "1" is stored in latch 20-1, 0 is stored in latch 20-2, "1" is stored in latch 20-3, "1" is stored in latch 20-4, and "0" is stored in latch 20-5, the binary value 00000011 is stored in the n-bit latch 21, this n-bit latch 21 outputting the value 00000011 to the latch output line 22.

Next, the second search operation with respect to the search data (1, 2, 3, 3) and the first search operation with respect to the search data (1, 0, 2, 3) are started (refer to FIG. 4).

With regard to the first search operation with respect to the search data (1, 0, 2, 3), the same type of processing is performed as described above with regard to the first search operation on the search data (1, 2, 2, 3). When that processing is completed, the latch 20-1 stores "1", the latch 20-2 stores "0", the latch 20-3 stores "0", the latch 20-4 stores "0", and the latch 20-5 stores "0", and the n-bit latch 21 stores, based on the latch control signal 24, the binary value of 00111111. The n-bit latch 21 outputs the stored condition of 00111111 to the latch output line 22.

The second search operation with respect to the search data (1, 2, 2, 3) is performed as follows, simultaneously with the first search operation with respect to the search data (1, 0, 2, 3).

In the second search operation, the states of the mask coincidence lines 19-1 to 19-8 are used and the states of the coincidence lines 7-1 to 7-8 are ignored.

Before the start of the second search operation with respect to (1, 2, 2, 3), the mask coincidence lines 19-1 to 19-8 are either pre-charged to a high level or pulled up to a high level via a resistance (not shown in the drawing), so that the mask coincidence lines 19-1 to 1 are the valid state of 1.

When the second operation starts, the n-bits latch 21 holds the results of 00000011 from the first search operation with respect to (1, 2, 2, 3).

With respect to the values of the latch output lines 22-1 to 22-8, the mask information stored in the associative memory words 8-3 and 8-5 are in complete coincidence, so that the corresponding mask coincidence lines 19-3 and 19-5 are placed in the high level.

Because there is no coincidence for the mask information stored in the remaining associative memory words 8-1, 8-2, and 8-4, the associative memory words 8-1, 8-2 and 8-4 output the invalid state of "0" to the corresponding mask coincidence lines 19-1, 19-2, and 19-4.

The latches 20-1 to 20-5 hold the results of the first search operation with respect to (1, 2, 2, 3), the latch 20-1 outputting the stored "1" to the corresponding mask coincidence line 19-1, the latch 20-2 outputting the stored "0" to the corresponding mask coincidence line 19-2, the latch 20-3, having stored "1", placing the corresponding mask coincidence line 19-3 in the high level, and the latch 20-4, having stored "1", placing the corresponding mask coincidence line 19-4 in the high level, and the latch 20-5 storing "0" outputs low level to the corresponding mask coincidence line 19-5.

Therefore, because the associative memory word 8-1 outputs "0" to the mask coincidence line 19-1, the mask coincidence line 19-1 is in the invalid state of "0".

Because the associative memory word 8-2 outputs "0" to the mask coincidence line 19-2 and the latch 20-2 also outputs "0", the mask coincidence line 19-2 is in the invalid state of "0".

Because the associative memory word 8-3 outputs "1" to the mask coincidence line 19-2, and the latch 20-3 also outputs "1" to the mask coincidence line 19-3, then, the mask coincidence line 19-3 is in the valid state of "1".

Because the associative memory word 8-4 outputs "0" to the mask coincidence line 19-4, and the latch 20-4 outputs "1" to the mask coincidence line 19-4, then, the mask coincidence line 19-4 is in the invalid state of "0".

Because the associative memory word 8-5 outputs "1" to the mask coincidence line 19-5, but the latch 20-5 is outputting "0", the mask coincidence line 19-5 is in the invalid state of "0".

Because of the above, only the mask coincidence lines 19-1 to 19-5 which correspond to the associative memory words 8-1 to 8-5 that coincide with the search data 105, taking into consideration the mask information, and also coincide with the states of the shortest mask lines 4-1 to 4-8 that are obtained by the first search operation will be in the valid state "1" at the end of the second search operation.

The above completes the first and second searches with respect to (1, 2, 2, 3), and the associative memory word 8-3 is selected as the result of the search.

Next, the second search operation with respect to the search data (1, 0, 2, 3) is started (refer to FIG. 5).

This operation as well, similar to the above-described second search operation with respect to (1, 2, 2, 3), only mask coincidence line 19-1 corresponding to the associative memory word 8-1 being in the valid state of "1", so that the associative memory word 8-1 is selected as the search result.

Figure 6:
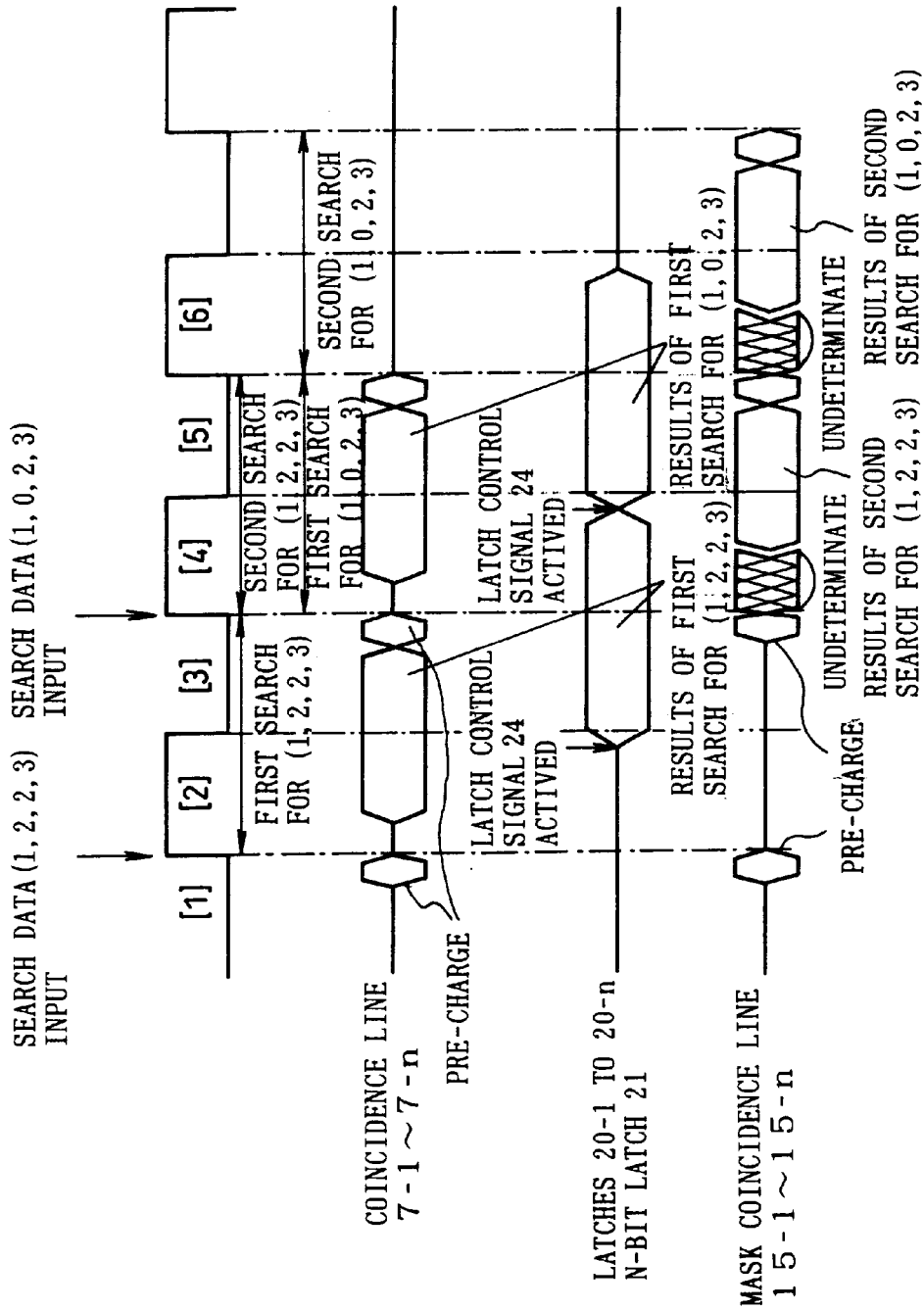
FIG. 6 is a timing diagram illustrating the operation of an embodiment of an associative memory according to the present invention.

FIG. 6 is a timing diagram that shows an example of the first search operation and the second search operation for the above-noted continuous searching in this embodiment of the present invention. In this drawing, [1] through [6] represent clock cycles.

In the latter half of clock cycle [1], all the bits lines, coincidence lines, and mask coincidence lines are pre-charged "1".

In clock cycle [2], at the rising edge of the clock, bit information corresponding to the first search data for each bit line is output. If this bit information and the corresponding stored data bit information in each associative memory word coincide or if the mask information corresponding bit is "1", the coincidence line of that memory word becomes the valid state "1", with the coincidence lines of the other associative memory words being the invalid state of "0". Additionally, the result of the logical AND of the mask bit information corresponding to associative memory words in the valid state is output to the shortest mask lines. At this point the latch control signal 24 is made active, so that the coincidence line value of each memory word is stored in latch 20. The bit information of each shortest mask line is stored in the n-bit latch 21, and is also output to the latch output line 22.

In clock cycle [3], all bit lines, coincidence lines 7 and mask coincidence lines 19 are pre-charged to a high level.

With regard to the mask coincidence lines 19, pre-charging to a high level is only done to mask coincidence lines of associative memory words for which "1" is stored in the latch 20.

In the clock cycle [4], at the rising edge of the clock only the mask coincidence line for which the bit information on the latch output line 22 coincides with the mask information in the associative memory word and also the latch 20 is storing "1", outputs the valid state of "1".

At the rising edge of the clock in the clock cycle [4], the bit information corresponding to the second search data is output. If either this bit information coincides with the bit information of the data stored in the corresponding associative memory word or the mask information for the corresponding bit is "1", the coincidence line 7 for that associative memory word is set to the valid state of "1", with other coincidence lines of associative memory words being at the invalid state of "0".

The result of the logical AND of the mask bit information corresponding to the associative memory words that are in the valid state is output to each shortest mask line. At this point the latch control signal 24 is made active, so that the coincidence line value of each memory word is stored in latch 20. The bit information of each shortest mask line is stored in the n-bit latch 21, and is also output to the latch output line 22.

At the clock cycle [5], all bit lines 6, coincidence lines 7, and mask coincidence lines 17 are pre-charged to a high level. With regard to the mask coincidence lines, pre-charging to a high level is only done to mask coincidence lines of associative memory words for which "1" is stored in the latch 20.

In the clock cycle [6], at the rising edge of the clock only mask coincidence line of memory word not only for which the mask information of the memory word coincides with the bit information on the latch output line 22 but also for which the latch 20 stores "1" outputs as the valid state "1".

Figure 7:
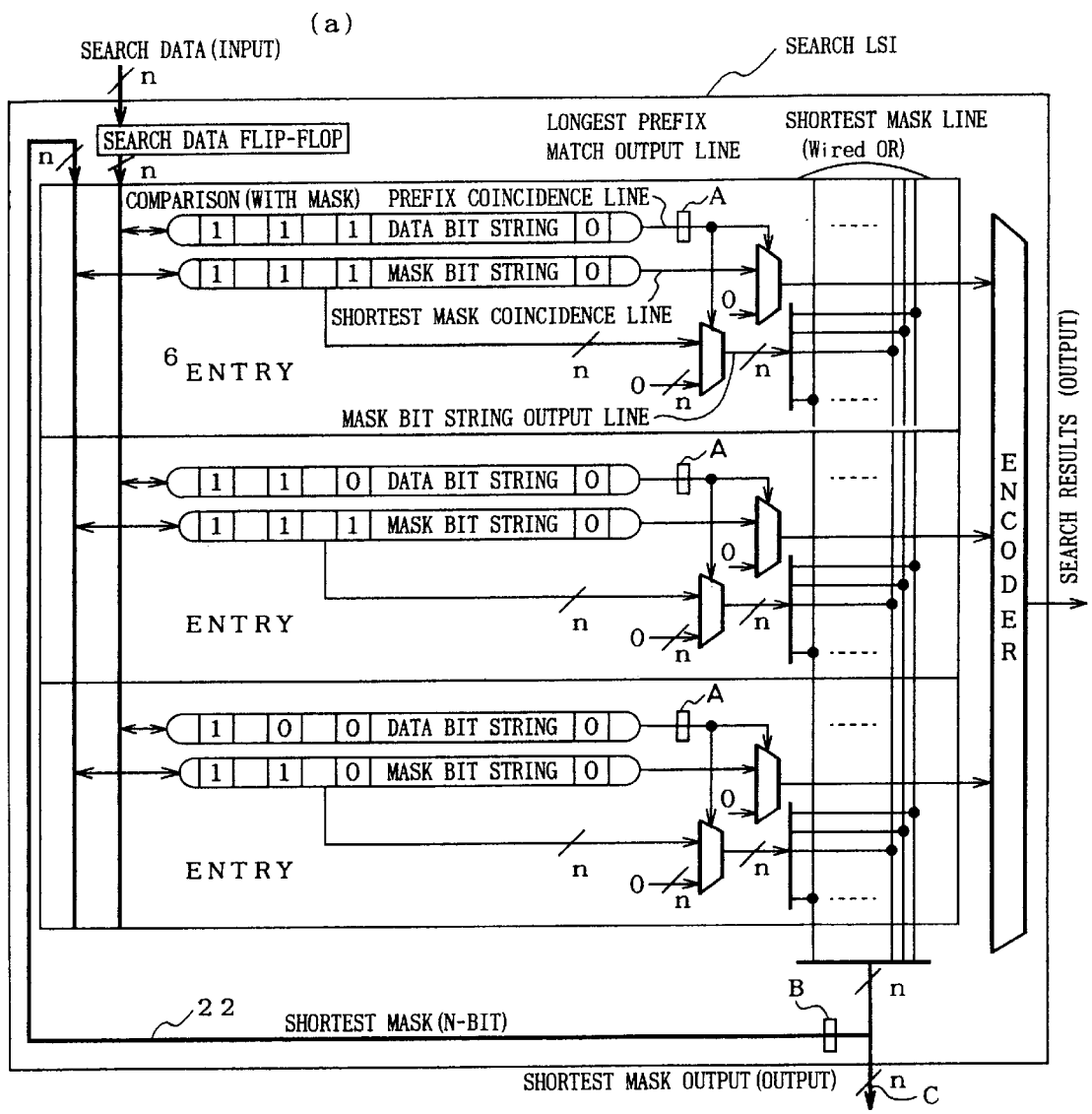
FIG. 7 is a drawing showing the configuration of a second embodiment of an associative memory according to the present invention.

Another embodiment of the present invention is described below. FIG. 7 is a block diagram that shows the circuit configuration of an LSI device having an associative memory with a shortest mask output function according to the present invention. In this embodiment, the configuration of the associative memory with a shortest mask output function is basically the same as the above-described embodiment that was described with reference to FIG. 1 and FIG. 2. This associative memory with a shortest mask output function is used in a router that performs forwarding of an IP packet. More specifically, this is suitable for use in performing a longest prefix match (LPM) in searching of an IP forwarding table comprising groups of destination fields and corresponding output interface information fields. In performing this search, the target of the search is a bit string of an arbitrary bit length starting from the MSB of an IP (Internet Protocol) address, this string being known as the prefix, in a destination field.

On the first search, a search data flip-flop latches the search data, the search data is transmitted from the bit line 6 to each entry (corresponding to an associative memory word 8 in FIG. 1). At each entry, as described earlier, a comparison is made between the search data and prefix data (data bit string), taking into consideration the mask information, so as to establish the associative memory words for which there are coincidence with the search data, and to establish the shortest mask of the entries that has the longest prefix of the entries with above coincidence. That is, in accordance with the result of a comparison between search data and prefix data, values are output to a prefix coincidence line (corresponding to the coincidence line 7 in FIG. 1) and to a mask bit string output line, a wired logic function of entries of mask bit lines of each entry being taken at the shortest mask line and, of the entries for which there was coincidence as the result of the prefix comparison, the shortest mask of the entry having a prefix length of the largest mask bit string (the number of continuous 1 bits from the MSB in the mask bit string) appears, this being latched into the n-bit latch (21 in FIG. 1).

At the second search, mask information (shortest mask) established at the first search is supplied via the latch output line 22 to the mask comparator of the associative memory cell, a comparison is performed between the mask bit string and the shortest mask value, so as to establish the associative memory cell that has the shortest mask information, this being output to the mask coincidence line (shortest mask coincidence line), the entry that was longest prefix matched being established via an encoder. For an entry for which there is coincidence between the mask bit string and the shortest mask bit information, "1" is output to the encoder, "0" being output to the encoder for other entries, "1" being output to the encoder for only an entry that was longest prefix matched, the address of the entry that was longest prefix matched as a result of the search being output. In the configuration shown in FIG. 7 as well, because the shortest mask bit line 6 which inputs semiconductor device to each entry from the search data flip-flop is separated from the line 22 for inputting of shortest mask information for comparison with the mask bits of each entry, when performing a continuous search, it is possible to simultaneously perform the second search operation of a search while the first search operation of the next search is being executed, the result being an increase in the number of searches that can be executed in a given period of time.

As described in detail above, according to the present invention, similar to the case of a conventional art associative memory with a shortest mask output function, in addition to being able to select, by means of the mask coincidence lines, which memory word is the ideal memory word in 2 clock cycles, a salient feature is that it is possible to input search data at the rising edge of the clock and perform continuous searching.

Whereas, as described above, a prior art associative memory with a shortest mask output function could input search data only every other clock, the present invention can perform twice the number of search operations per unit time.

What is claimed is:

1. An associative memory with a shortest mask output function comprising, a plurality of data cells that store data to be searched, a plurality of mask cells that store mask data corresponding to said data stored in said data cells, a plurality of first comparators for said data cells which compare a search data with said data stored in said data cells, a plurality of second comparators for said mask cells which compare a shortest mask data with said mask data stored in said mask cells, a plurality of shortest mask lines which detect said shortest mask data which are obtained based on comparison results of said first comparators and said mask data stored in said mask cells, wherein said associative memory further comprising, a plurality of first bit lines for inputting said search data to said first comparators, and a plurality of second bit lines for inputting said shortest mask data to said second comparators.

2. An associative memory with a shortest mask output function according to claim 1, wherein, said associative memory further comprising, a plurality of coincidence lines which output said comparison results of said first comparators, a plurality of mask coincidence lines which output comparison results of said second comparators, a plurality of logic circuits which control said shortest mask lines based on said comparison results of said first comparators and mask data stored in said mask cells, a plurality of first latches which hold states of said coincidence lines and control said mask coincidence lines based on states of said coincidence lines, and a second latch which outputs said shortest mask data to said second bit lines.

3. A search method of an associative memory with a shortest mask output function having a plurality of associative memories, said associative memories comprising a plurality of data cells that store data to be searched and a plurality of mask cells that store mask data corresponding to said data stored in said data cell, a plurality of first comparators for said data cells which compare a search data with said data stored in said data cells, a plurality of second comparators for said mask cells which compare a shortest mask data with said mask data stored in said mask cells, a plurality of shortest mask lines which detect said shortest mask data which are obtained based on comparison results of said first comparators and said mask data stored in said mask cells, a plurality of first bit lines for inputting said search data to said first comparators, a plurality of second bit lines for inputting said shortest mask data to said second comparators, a plurality of coincidence lines which outputs said comparison results of said first comparators, a plurality of mask coincidence lines which outputs comparison results of said second comparators, a plurality of logic circuits which control said shortest mask lines based on said comparison results of said first comparators and mask data stored in said mask cells, a plurality of first latches which holds state of said coincidence line and controls said mask coincidence line based on states of said coincidence line, a second latch which outputs said shortest mask data to said second bit lines, wherein at a first search operation, said search data is input to each associative memory word from said first bit lines, a comparison being performed in said first comparator by comparing said data cell value stored in each of said associative memory words with value of said first bit line, using said mask data in said mask cell, making coincidence lines corresponding to associative memories word for which coincidence are detected by said first comparators, effective, holding a state of said coincidence line in said first latch, a plurality of said logic circuit controlling said shortest mask lines based on said comparison results of said first comparators and mask data stored in said mask cells, taking a wired-AND with respect to each one of said shortest mask lines and a result thereof being stored in said second latch, and at a second search operation, output data of said second latch is input to said second comparator of each associative memory word via said second bit lines, a comparison between a data value on said second bit line and a data value stored in said mask cell being performed in each associative memory word, in a case when a mask data in said mask cell coincides with bit data on said second bit lines, only mask coincidence line to which said first latch outputs coincidence state on said coincidence line, is selected.

4. A search method of an associative memory with a shortest mask output function according to claim 3, when continuous searching is performed, said associative memory performs said second search operation of a previous search simultaneously with said first search operation of a subsequent search.

5. A search method of an associative memory with a shortest mask output function, said associative memory being used for a router to perform forwarding operation for Internet Protocol packets, said associative memory including an IP forwarding table comprising destination fields and corresponding output interface information fields, wherein at a first search operation, an associative memory words for which prefix data that is designated an arbitrary length string of bits starting from a MSB of an IP address coincides with a search data, are selected, and detecting shortest mask corresponding to an associative memory word having the longest prefix among a plurality of coinciding associative memories, and at a second search operation, said shortest mask obtained at said first search operation is supplied to mask comparators of said associative memories, whereby detecting an associative memory word having said shortest mask.

* * * * *